(12) United States Patent
Maejima et al.

(10) Patent No.: US 7,259,985 B2
(45) Date of Patent: Aug. 21, 2007

(54) SEMICONDUCTOR MEMORY DEVICE

(75) Inventors: Hiroshi Maejima, Chigasaki (JP); Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 11/245,195

(22) Filed: Oct. 7, 2005

(65) Prior Publication Data
US 2006/0140013 A1 Jun. 29, 2006

(30) Foreign Application Priority Data
Dec. 28, 2004 (JP) .............................. 2004-379483

(51) Int. Cl.
*G11C 11/24* (2006.01)
*G11C 7/12* (2006.01)

(52) U.S. Cl. ........................... 365/185.01; 365/185.29; 365/189.06

(58) Field of Classification Search ........... 365/185.17, 365/185.29, 185.06, 185.27, 185.21, 185.01
See application file for complete search history.

(56) References Cited

U.S. PATENT DOCUMENTS 6,907,497 B2 6/2005 Hosono et al.
2002/0172077 A1* 11/2002 Ha ........................ 365/185.25
2004/0170056 A1* 9/2004 Shibata et al. ......... 365/185.03

FOREIGN PATENT DOCUMENTS

JP 2003-249083 9/2003

OTHER PUBLICATIONS

Tomoharu Tanaka, et al., "A Quick Intelligent Page-Programming Architecture and a Shielded Bitline Sensing Method for 3 V-Only NAND Flash Memory", IEEE Journal of Solid-State Circuits, vol. 29, No. 11, Nov. 1994, pp. 1366-1373.

* cited by examiner

*Primary Examiner*—Richard T. Elms
*Assistant Examiner*—Douglas King
(74) *Attorney, Agent, or Firm*—Oblon, Spivak, McClelland, Maier & Neustadt, P.C.

(57) ABSTRACT

A semiconductor memory device includes a memory cell array with electrically rewritable and non-volatile memory cells arranged therein, and a bit line control circuit connected to a bit line of the memory cell array to control and detect the bit line voltage in accordance with operation modes, wherein the bit line control circuit comprises a first transistor and a second transistor with a breakdown voltage higher than that of the first transistor, the second transistor being disposed between the first transistor and a bit line in the memory cell array to be serially connected to the first transistor, and wherein a connection node between the first and second transistors is fixed in potential at a data erase time.

13 Claims, 12 Drawing Sheets

EMBODIMENT

| | | BIAS-Tr Q23, Q24 | | | BLS-Tr Q21, Q22 | | | BLCLAMP-Tr Q1 | | | BLPRE-Tr Q2 | | | VPRE |
|---|---|---|---|---|---|---|---|---|---|---|---|---|---|---|
| | | Gate | BL | BLCRL | Gate | BL | SABL | Gate | SABL | TDC | Gate | TDC | VPRE | |
| WRITE | Selected BL | Vss | Vdd | Vdd | VREADH | Vdd | Vdd | Vsg | Vdd | Vdd | Vss | Vdd or Vss | Vss | Vss |
| | Selected BL | Vss | Vss | Vdd | VREADH | Vss | Vss | Vsg | Vss | Vss | | | | |
| | Unselected BL | VREADH | Vdd | Vdd | Vss | Vdd | Vdd or Vss | Vsg | Vdd or Vss | Vdd or Vss | | | | |
| READ | Selected BL | Vss | Vpre | Vss | VREADH | Vpre | Vpre | Precharge & Sense | | | Vsg or Vss | — | Vdd | Vdd |
| | Unselected BL | VREADH | Vss | Vss | Vss | Vss | Vpre | Vsg | Vsg | Vdd(or Vss) | Vsg | Vdd | Vdd | Vdd |
| ERASE | | Vdd | Vera | Vdd | Vdd | Vera | Vdd (or Vss) | Vsg | Vdd(or Vss) | Vdd (or Vss) | Vsg | Vdd (or Vss) | Vdd (or Vss) | Vdd (or Vss) |

VREADH = 7.5V ($\geqq$ Vdd+Vth2)
Vsg = 4.3V ($\geqq$ Vdd+Vth1)
Vpre = 0.7V (= Vdd−$\alpha$)
Vera = 20V

FIG. 9

CONVENTIONAL CASE

| | | BIAS-Tr Q23, Q24 | | | BLS-Tr Q21, Q22 | | | BLCLAMP-Tr Q1 | | | | BLPRE-Tr Q2 | | | VPRE |
|---|---|---|---|---|---|---|---|---|---|---|---|---|---|---|---|
| | | Gate | BL | BLCRL | Gate | BL | SABL | Gate | SABL | TDC | | Gate | TDC | VPRE | |
| WRITE | Selected BL | Vss | Vdd | Vdd | VREADH | Vdd | Vdd | Vsg | Vdd | Vdd | | Vss | Vdd or Vss | VPRE | Vss |
| | Selected BL | Vss | Vss | Vdd | VREADH | Vss | Vss | Vsg | Vss | Vss | | | | | |
| | Unselected BL | VREADH | Vdd | Vdd | Vss | Vdd | Vdd or Vss | Vss | Vdd or Vss | Vdd or Vss | | | | | |
| READ | Selected BL | Vss | Vpre | Vss | VREADH | Vpre | Vpre | Precharge & Sense | | | | Vsg or Vss | — | — | Vdd |
| | Unselected BL | VREADH | Vss | Vss | Vss | Vss | Vpre | | | | | | | | |
| ERASE | | Vdd | Vera | Vdd | Vdd | Vera | Floating | Vss | Floating | Floating | | Vss | Floating | Vss | Vss |

VREADH=7.5V (≧ Vdd+Vth2)
Vsg=4.3V (≧ Vdd+Vth1)
Vpre=0.7V (= Vdd−α)
Vera=20V

SEMICONDUCTOR MEMORY DEVICE

CROSS-REFERENCE TO RELATED APPLICATION

This application is based on and claims the benefit of priority from the prior Japanese Patent Application No. 2004-379483, filed on Dec. 28, 2004, the entire contents of which are incorporated herein by reference.

BACKGROUND OF THE INVENTION

1. Field of the Invention

This invention relates to a semiconductor memory device, in which electrically rewritable and non-volatile memory cells are arranged.

2. Description of Related Art

A NAND-type flash memory is known as one of EEPROMs, which is constituted by arranging electrically rewritable and non-volatile semiconductor memory cells. In the NAND-type flash memory, a plurality of memory cells are connected in series in such a manner that adjacent two cells share a source/drain diffusion layer, thereby constituting a NAND cell unit. The NAND-type flash memory has a basic property that the unit cell area is smaller than that of NOR-type one, thereby being possible to easily achieve a great memory capacitance.

A sense amplifier circuit of the NAND-type flash memory is usually formed to have a clamping transistor for clamping the bit line voltage and transferring a bit line voltage to a sense node, a precharging transistor for prercharging a bit line and the sense node and a data latch for storing the bit line data transferred to the sense node.

If the bit line pitch is more miniaturized, it becomes difficult to dispose sense amplifiers at the respective bit lines, and influence of noises between adjacent bit lines will be increased. For this reason, a shared sense amplifier scheme is usually utilized, in which adjacent two bit lines share a sense amplifier. In this scheme, a non-selected bit line disposed adjacent to a selected bit line is used as a shield line at a data read time. Further, in this shared sense amplifier scheme, it is prepared a bit line select circuit in a sense amplifier circuit, and a sense amplifier is selectively coupled to one of the adjacent two bit lines (see, for example, Unexamined Japanese Patent Application Publication No. 2003-249083).

In the NAND-type flash memory, data erasure is performed by a block. At a data erase time, an erase voltage of about 20V is applied to a p-type well on which the memory cell array is formed under the condition of: the entire word lines in a selected block are set at 0V; and the entire bit lines are set in a floating state. At this time, the bit lines will be boosted to about 20V because a forward bias is applied between the n-type diffusion layer to which the bit lines are connected and the p-type well.

In consideration of the above-described bit line boost at the data erase time, it is required to use a high voltage transistor as a bit line select transistor (i.e., a gate insulating film of which is thicker than that of a clamping transistor) in the sense amplifier.

On the other hand, the connect node SABL is usually formed as a signal wiring running in parallel with the bit lines due to the layout convenience of the sense amplifier circuit. With this layout, if the bit lines are boosted in voltage at the data erase time, the connect node SABL disposed adjacent to the bit lines will be boosted by capacitive coupling. Therefore, there is danger that the clamping transistor, i.e., a low voltage transistor, may be destroyed.

SUMMARY OF THE INVENTION

According to an aspect of the present invention, there is provided a semiconductor memory device including a memory cell array with electrically rewritable and non-volatile memory cells arranged therein, and a bit line control circuit connected to a bit line of the memory cell array to control and detect the bit line voltage in accordance with operation modes, wherein the bit line control circuit comprises a first transistor and a second transistor with a breakdown voltage higher than that of the first transistor, the second transistor being disposed between the first transistor and a bit line in the memory cell array to be serially connected to the first transistor, and wherein a connection node between the first and second transistors is fixed in potential at a data erase time.

DETAILED DESCRIPTION OF THE EMBODIMENTS

Illustrative embodiments of this invention will be explained with reference to the accompanying drawings below.

Figure 1:
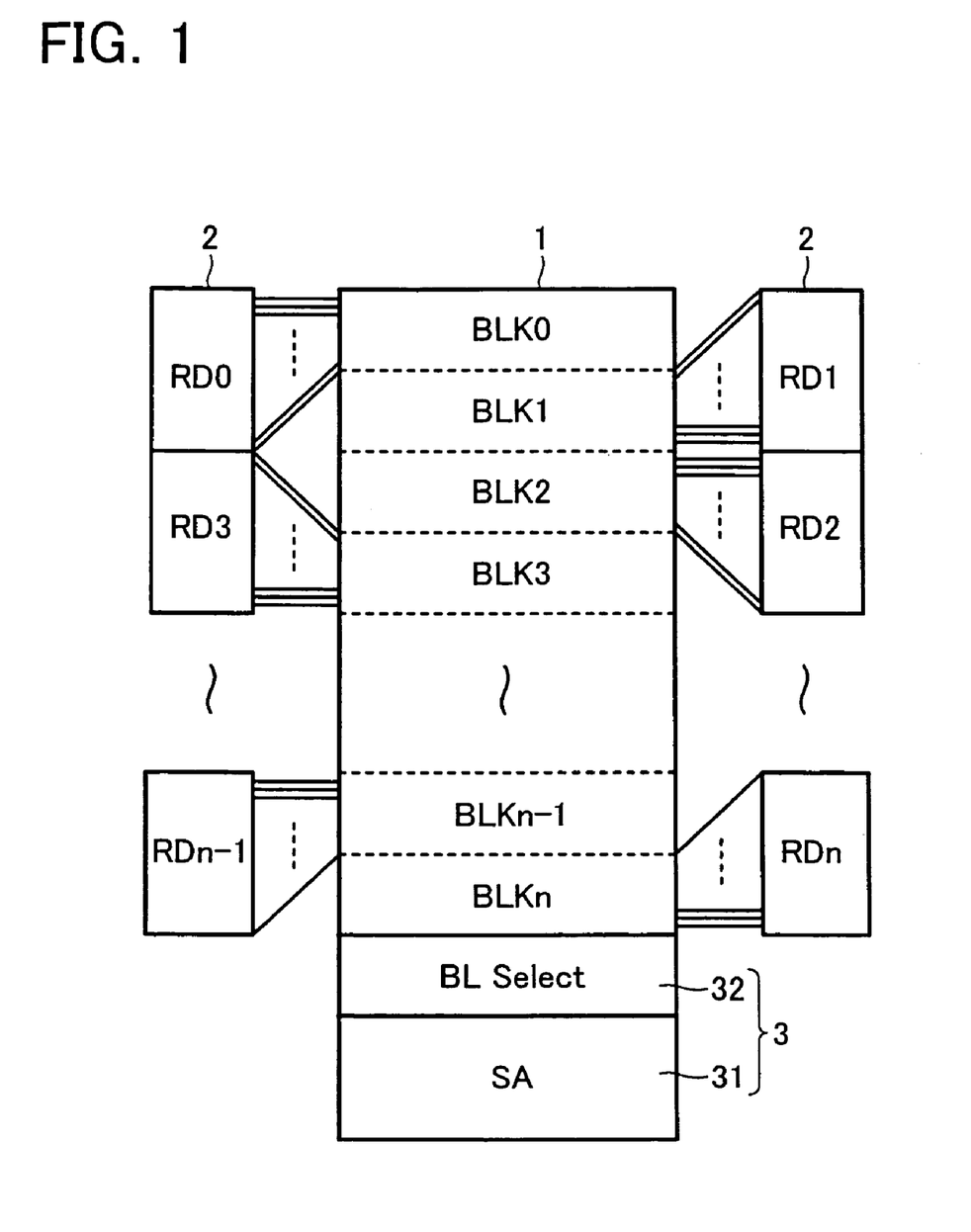
FIG. 1 shows a memory core circuit of a NAND-type flash memory in accordance with an embodiment of the present invention.
Figure 2:
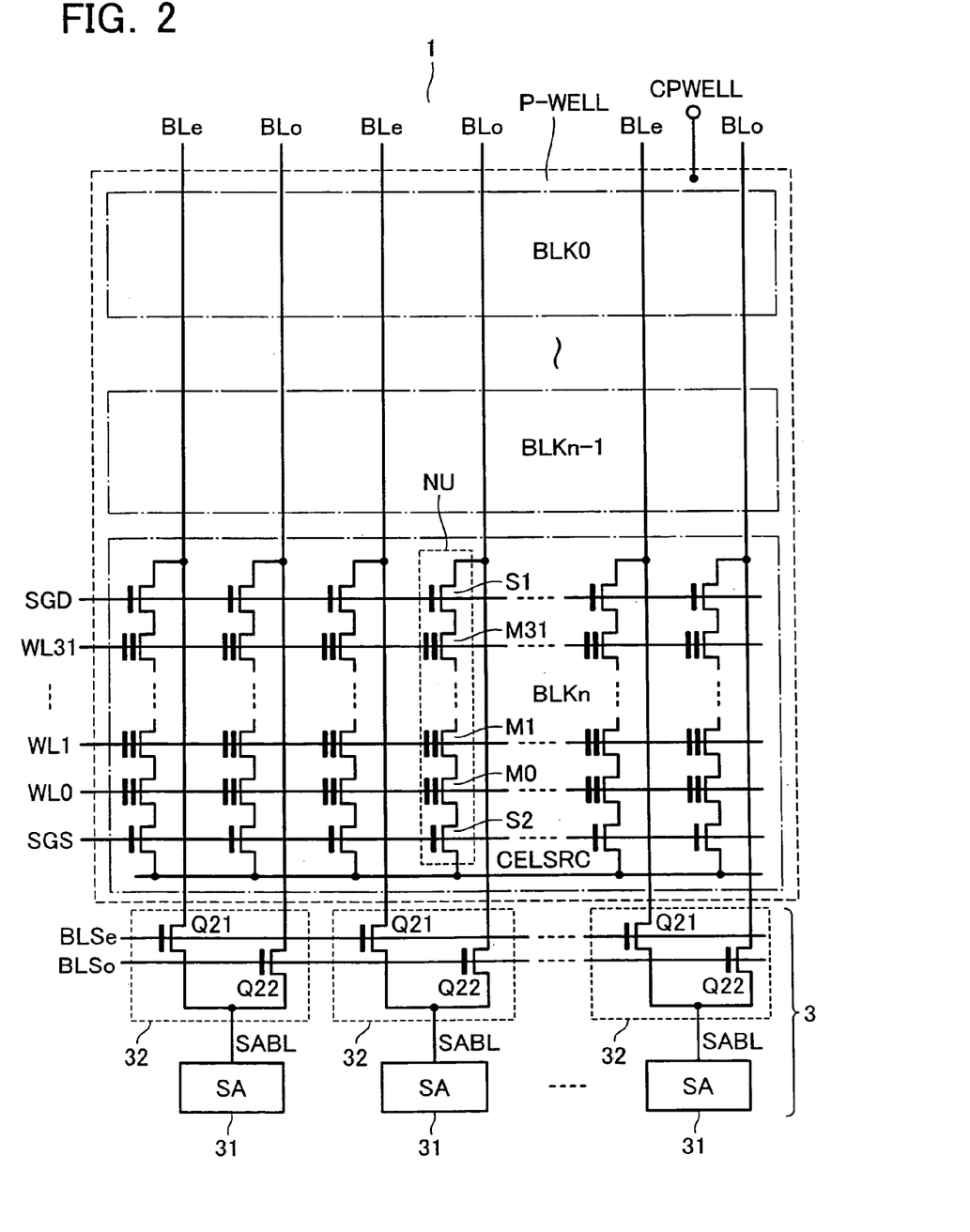
FIG. 2 shows the arrangement of the memory cell array of the flash memory.

FIG. 1 shows a schematic layout of a memory core circuit of a NAND-type flash memory in accordance with an embodiment, and FIG. 2 shows an equivalent circuit arrangement of the memory cell array 1.

The memory cell array 1 is formed of a plurality of NAND cell units NU arranged therein. Each NAND cell unit NU has a plurality of (e.g., thirty two in this case) electrically rewritable and non-volatile memory cells, M0-M31, connected in series, and one end thereof is coupled to a bit line BLe (or BLo) via a select gate transistor S1; and the other end to a common source line CELSRC via another select gate transistor S2.

Control gates of the memory cells M0-M31 in a NAND cell unit are connected to different word lines WL (WL0-WL31), respectively. Gates of the select gate transistors S1 and S1 are connected to select gate lines SGD and SGS, respectively, which are disposed in parallel with the word lines WL.

A set of NAND cell units sharing a word line constitutes a block, which serves as a unit of data erasure. As shown in FIG. 2, a plurality of blocks BLK (BLK0, BLK1, . . . , BLKn) are arranged in the direction of the bit line. A set of memory cells sharing a word line constitute two sectors, each serves as a unit of data read and write. That is, memory cells selected by a word line WL and the entire even bit lines BLe constitute a first sector; and memory cells selected by the word line WL and the entire odd bit lines BLo constitute a second sector.

In case of two-value (i.e., binary) data storage scheme, one sector serves as a page, and data read and write are performed by a page. In case of four-value data storage scheme, in which one memory cell stores two bits, one sector serves as two pages with upper page (i.e., upper bit) data and lower page (i.e., lower bit) data, thereby resulting in that a set of memory cells arranged along a word line is classified into four pages.

The memory cell array 1 is formed on a p-type well, P-WELL, with a well node, CPWELL, to which predetermined bias voltages are applied in accordance with operation modes. For example, the well node CPWELL is applied with 0V at data read time and data write time, and applied with an erase voltage, Vera (e.g., about 20V), at an erase time.

A word line control circuit (i.e., row decode circuit) 2, which serves for controlling the word lines of the memory cell array 1, is formed of plurality of row decoders RD (RD0, RD1, . . . , RDn) dispersedly disposed at the both sides in the word line direction of the memory cell array 1. That is, as shown in FIG. 1, the row decoders RD are alternately disposed at the left sides and right sides for the respective blocks BLK.

A bit line control circuit (i.e., sense amplifier circuit) 3, which is connected to the bit lines in the memory cell array 1 for controlling and detecting bit line voltages, has sense amplifiers (SA) 31 constituting a page buffer and bit line select circuits 32, each of which is disposed between each sense amplifier 31 and adjacent two bit lines. That is, a sense amplifier 31 will be connected to either one of adjacent even/odd bit lines BLe/BLo, which is selected by the bit line select circuit 32.

Figure 3:
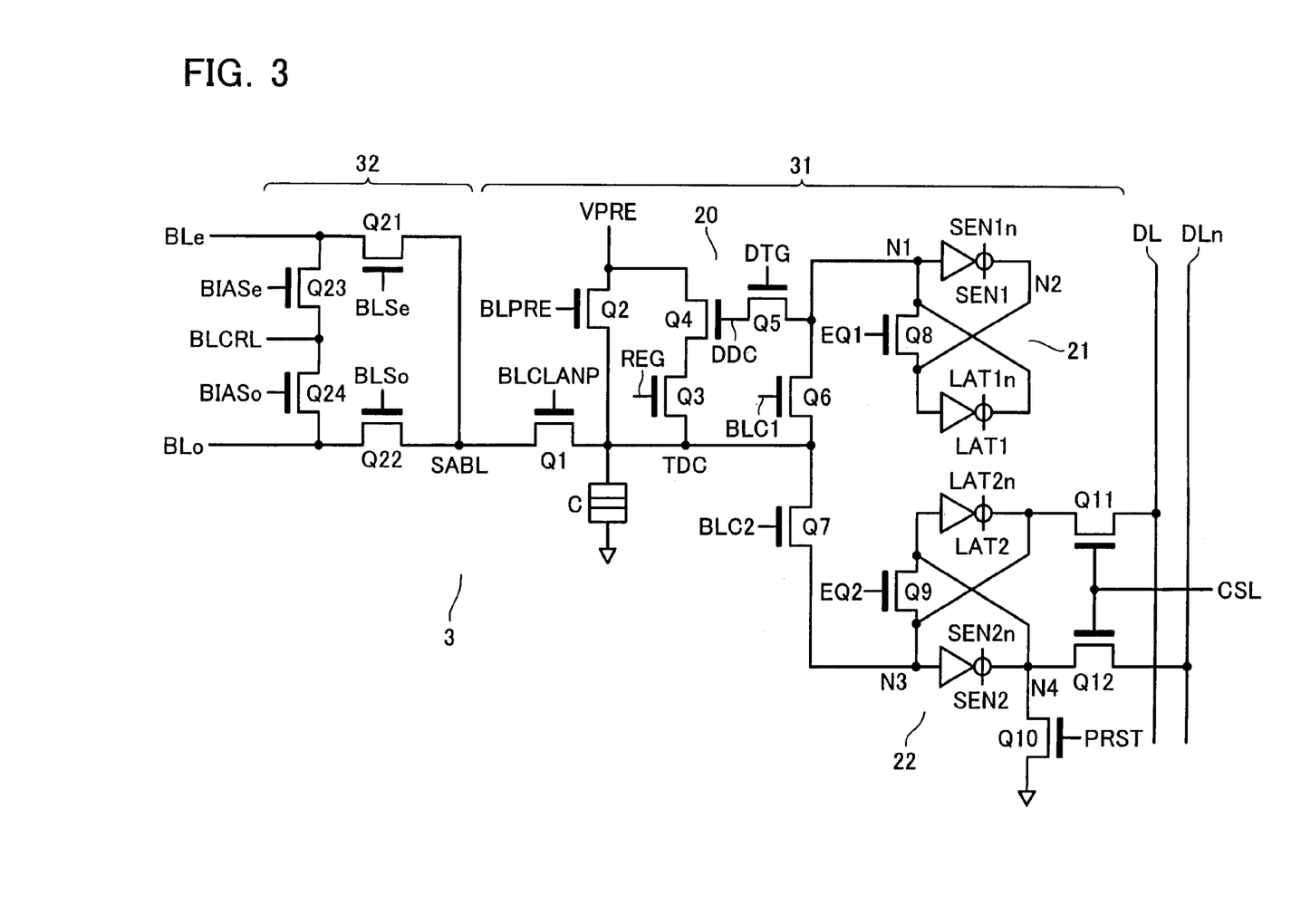
FIG. 3 shows a sense unit in a sense amplifier circuit of the flash memory.

FIG. 3 shows a detailed configuration of a sense unit of the sense amplifier circuit 3, which is disposed for a pair of even/odd bit lines BLe/BLo. One sense unit has, as shown in FIG. 3, a sense amplifier 31, which the even/odd bit lines BLe/BLo share, and a bit line select circuit 32 for selectively coupling the even/odd bit lines BLe/BLo to the sense amplifier 31.

The bit line select circuit 32 has bit line select transistors Q21, Q22, which are selectively driven by bit line select signals BLSe, BLSo to couple the bit lines BLe, BLo to a node SABL of a clamping transistor Q1, and biasing transistors Q23, Q24 for applying a bias voltage BLCRL to the bit lines BLe, BLo when these are unselected. Each of these transistors in the bit line select circuit 32 is a high breakdown voltage one, i.e., a high voltage (HV) transistor, with a gate insulating film thicker than that of transistors in the sense amplifier 31.

The sense amplifier 31 has a clamping transistor Q1 disposed between a sense node TDC and the node SABL, and a precharging transistor Q2, one end of which is connected to the sense node TDC. The clamp transistor Q1 serves for connecting the sense node TDC to a selected bit line when the gate BLCLAMP is driven by a control signal in a certain operation mode. For example, the clamp transistor Q1 serves for clamping the bit line voltage and serves as a pre-sense amplifier for amplifying a signal voltage on the bit line based on charge-sharing between the sense node TDC and the bit line so as to transfer it to the sense node. A capacitor C is connected to the sense node TDC for holding signal charge.

The sense node TDC is connected to a data node of a data latch 21, which stores read data and write data, via a transferring transistor Q6. Disposed between the data node N1 and the sense node TDC is a data storage circuit (i.e., write back circuit) 20, which serves for temporarily holding write data of the last write cycle and writing back write data of the next write cycle in a data write mode. Gate DDC of a transistor Q4 serves as a data storage node.

A transferring transistor Q5 is for transferring the data at the data node N1 to the storage node DDC. In case the data of the storage node DDC is "H" (i.e., "1" write data), it will be written back to the sense node TDC after verify-read and transferred to the data latch 21. For this aid, a write back transistor Q3 is disposed between the transistor Q4 and the sense node TDC.

The sense node TDC is further connected to a data node N3 of another data latch 22, which serves as a data cache, via a transferring transistor Q7. Date nodes N3 and N4 of this data latch 22 are connected to a pair of data lines DL and DLn via column gate transistors Q11 and Q12, respectively, which are driven by a column select signal CSL.

In a data read mode, read out data is transferred to the data latch 22, and then subjected to column selection to be output to an input/output terminal via the data lines DL, DLn and an output buffer (not shown). In a data write mode, write data supplied to the input/output terminal is subjected to column selection to be temporarily stored in the data latch 22, and then transferred to the data latch 21. Data write will be performed based on the write data loaded in the data latch 21.

All transistors used in the sense amplifier 31 are low breakdown voltage ones, i.e., low voltage (LV) transistors with a gate insulating film thinner than that of transistors in the bit line select circuit 32.

Figure 4:
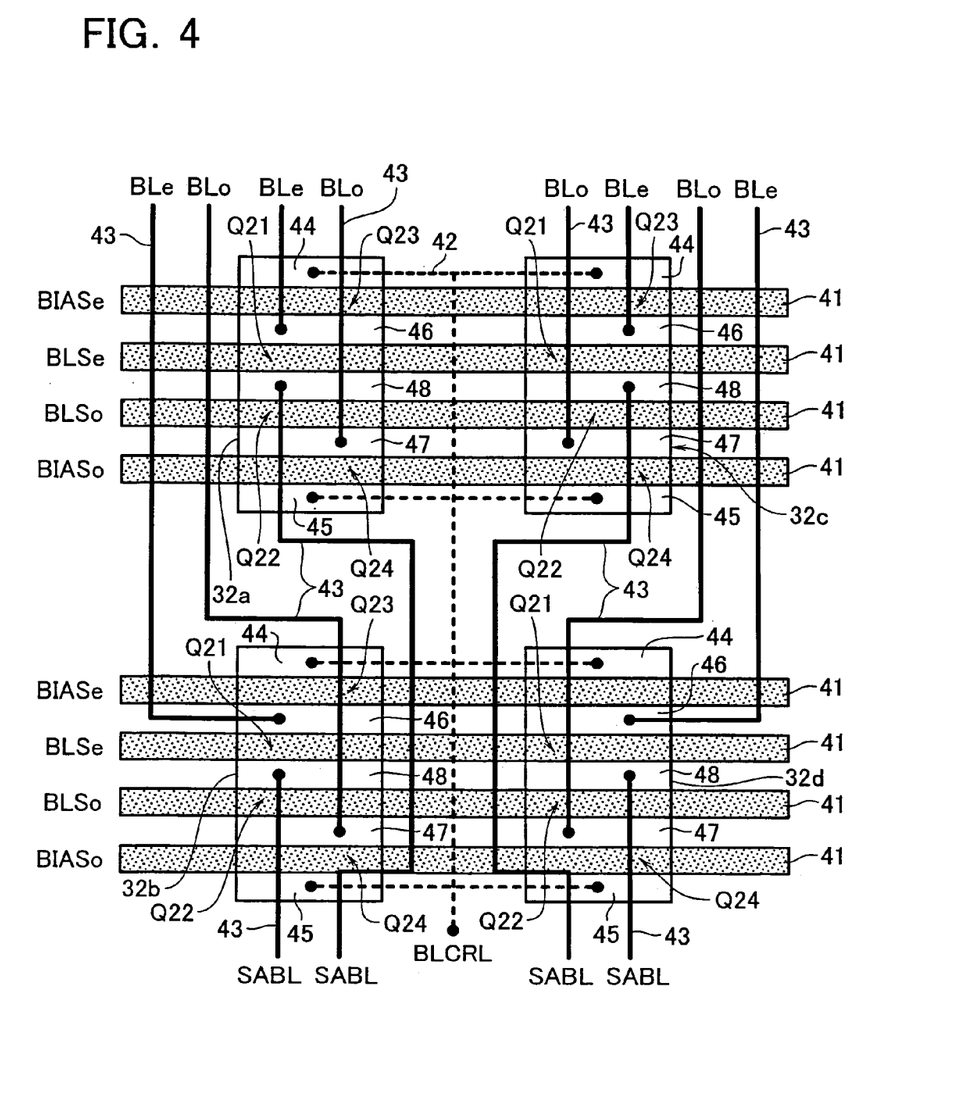
FIG. 4 shows a layout example of bit line select circuit portions of the flash memory.
Figure 5:
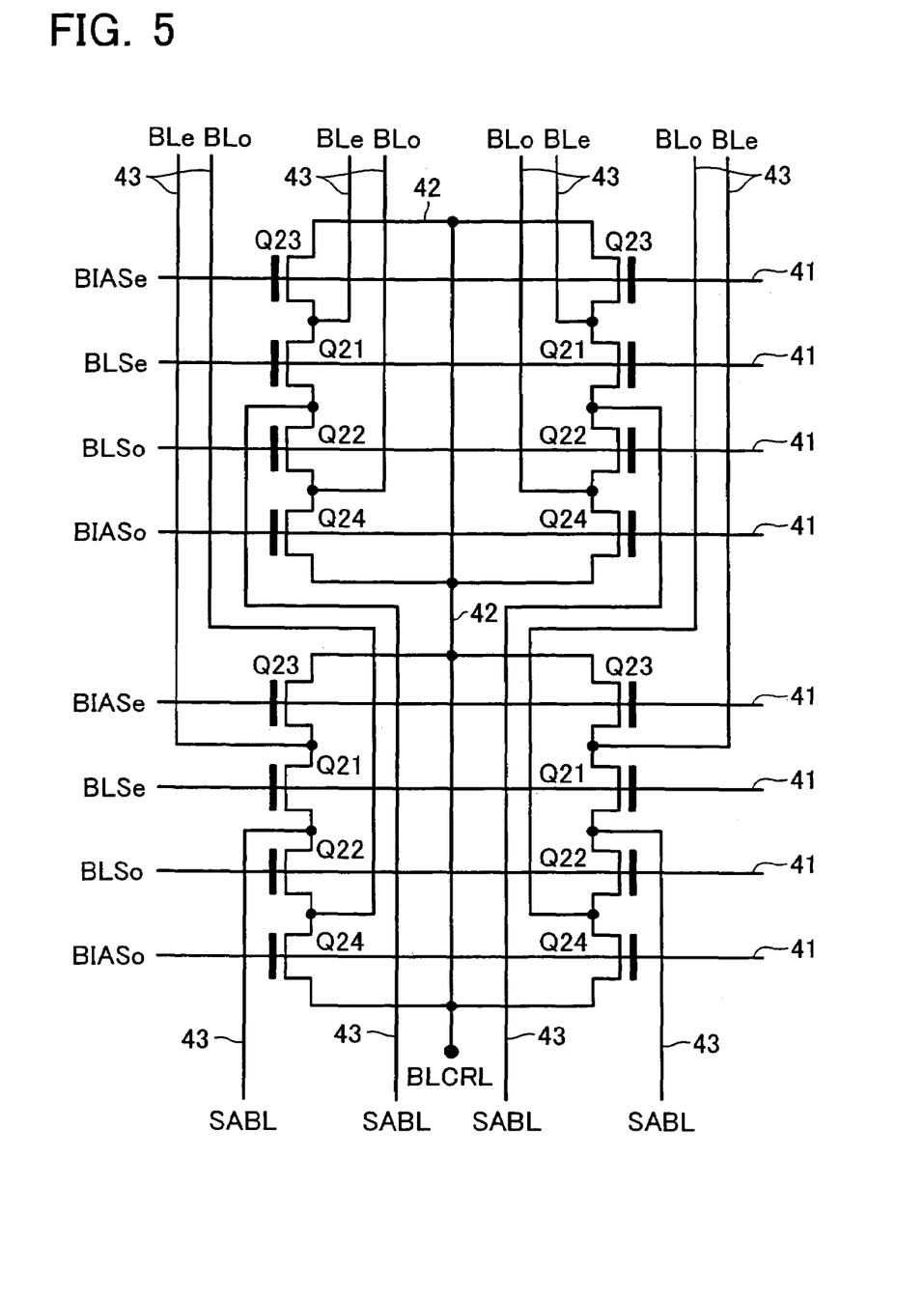
FIG. 5 shows the layout example of the bit line select circuit portions with equivalent circuit symbols.

FIG. 4 shows a schematic layout of a circuit portion with some bit line select circuits 32 in the sense amplifier circuit 3, and FIG. 5 shows the layout with equivalent circuit devices. In each of circuit areas (i.e., device formation regions) 32a-32d, on each of which the bit line select circuit 32 is formed for selecting one of a pair of even/odd bit lines, four transistors Q21-Q24 are arranged in the direction of the bit line. Two device formation regions 32a and 32b, which are used for adjacent two pairs of bit lines, are arranged in the direction of the bit line; and other two device formation regions 32c and 32d, which are disposed adjacent to the regions 32a and 32b, respectively, are also arranged in the direction of the bit line.

As described above, many transistors are arranged in the direction of the bit line in the bit line select circuits. The reason will be explained as follows. As a result of that the bit line pitch was miniaturized, it is impossible to dispose plural HV transistors in the bit line pitch.

In each of the device formation regions 32a-32d, bit lie select transistors Q21, Q22 and bit line bias transistors Q23, Q24 are formed. Gate lines 41, to which bit line select signals BLSe, BLSo and bias select signals BIASe, BIASo are applied, are formed as being elongated in the direction perpendicular to the bit line so to be extended into plural device formation regions arranged in the direction perpendicular to the bit line.

A first metal wiring 42, which is shown by a dotted line in FIG. 4, are connected in common to one node diffusion layers 44 and 45 of the bias transistors Q23 and Q24, and this is drawn to a bias terminal BLCRL. Bit lines BLe and BLo, which are formed of second metal wirings 43 shown by solid lines in FIG. 4, are connected to common diffusion layers 46 shared by the bit line select transistors Q21 and bias transistors Q23, and common diffusion layers 47 shared by the bit line select transistor Q22 and bias transistor Q24, respectively.

The connection node SABL, which is located between the sense amplifier 31 and the bit line select circuit 32, are formed of the second metal wirings 43 in such a manner that at least a part thereof runs in parallel with the bit lines BLe and BLo. This is a result of that two device formation regions 32a and 32b, and other two device formation regions 32c and 32d are aligned in the direction of the bit lines, respectively. That is, each the metal wiring 43, which constitutes a connection node SABL, is formed in such a manner that one end thereof is coupled to a common diffusion layer 48 shared by the bit line select transistor Q21 and Q22; and the other to a diffusion layer (not shown) of the clamping transistor Q1.

As described above, the node SABL and bit lines are formed with the same metal layer to run in part in parallel with each other. Due to this, in case the node SABL is set in a floating state in the data erase mode, the voltage boost of the bit line with the erase voltage application leads the voltage boost of the node SABL due to capacitive coupling between them. If the node SABL is boosted to be higher than the power supply voltage (e.g., to about 10V), it causes the clamping transistor Q1 and other LV transistors in the sense amplifier 31 to be destroyed or reduced in reliability.

Considering this view point, the connection node SABL located between the sense amplifier 31 and the bit line select circuit 32, i.e., located between the bit line select transistors (HV transistors) Q21, Q22 and the clamping transistor (LV transistor) Q1, will be fixed in a certain potential in this embodiment so that the LV transistors are not destroyed.

Figure 6:
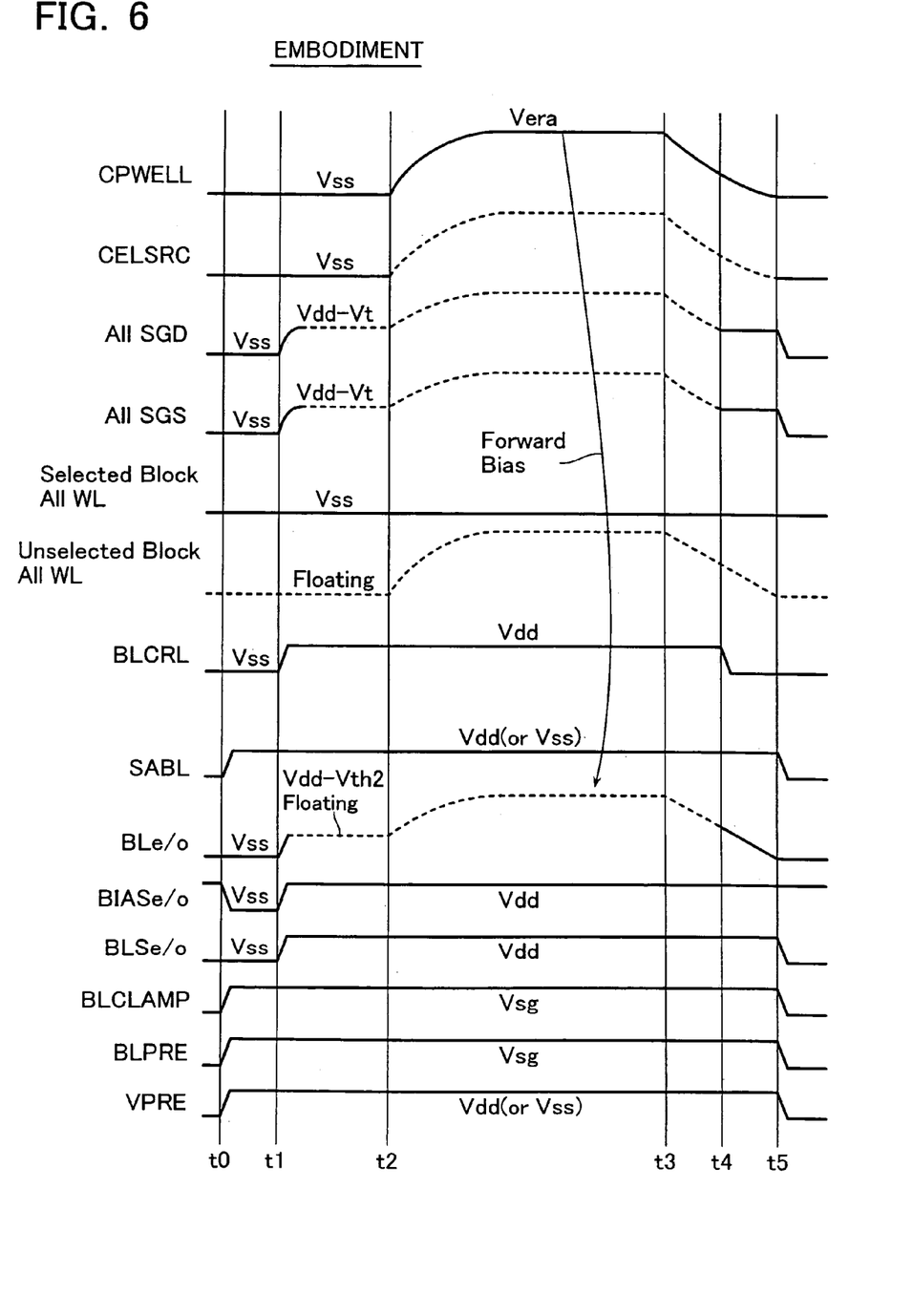
FIG. 6 shows waveforms of a data erase operation of the flash memory.
Figure 7:
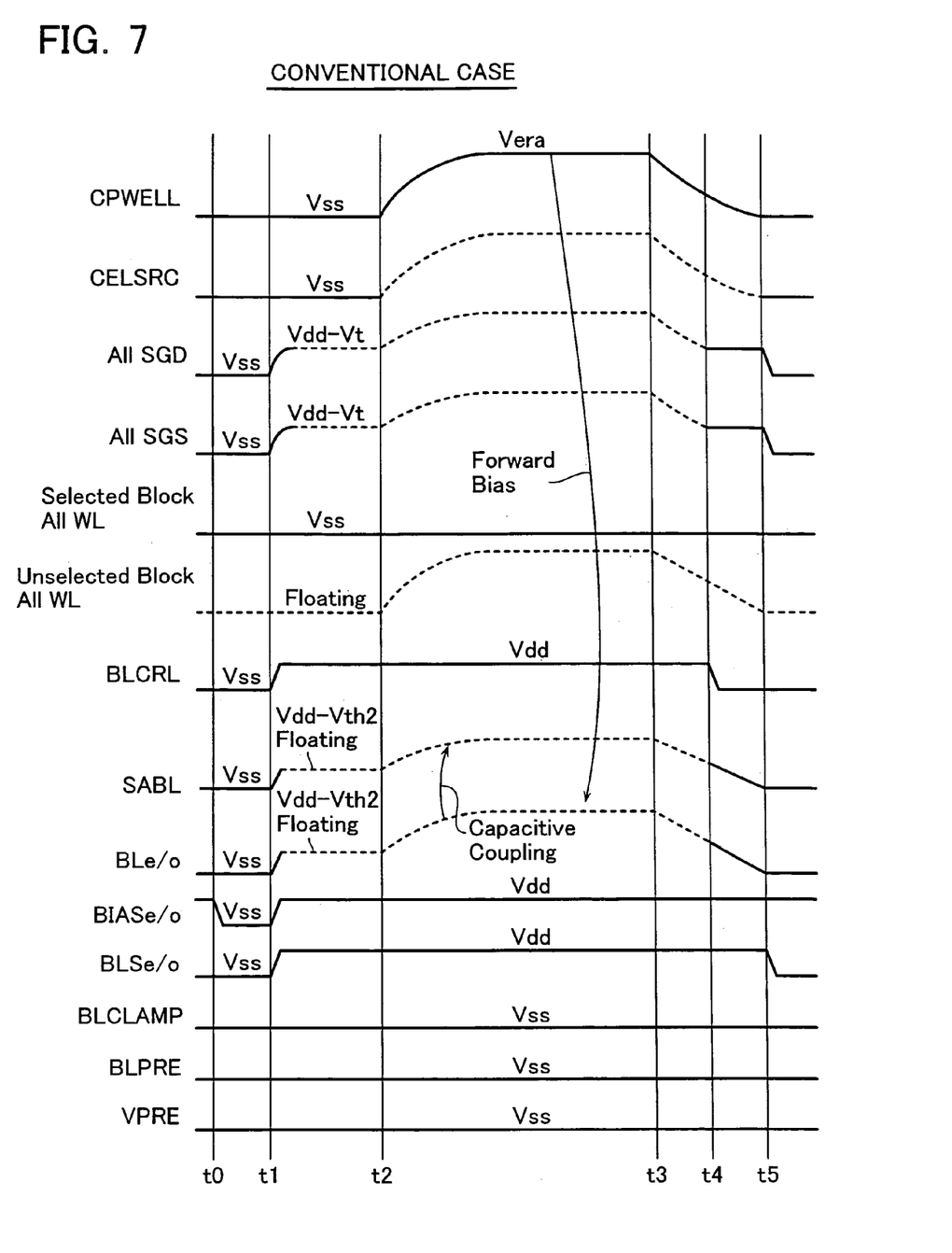
FIG. 7 shows waveforms of a data erase operation in a conventional flash memory.

FIG. 6 shows operation waveforms in a data erase mode of this embodiment, and FIG. 7 shows operation waveforms in a conventional case for comparing with those in FIG. 6. Data erase is performed by a block. At the erase time, the entire word lines WL in a selected block are set at ground potential (Vss) while the entire word lines in unselected blocks are set in a floating state. Further, the entire select gate lines SGD and SGS in the memory cell array are set in a floating state of Vdd−Vt (at timing t1). With this state, apply an erase voltage Vera (about 20V) to the well terminal CPWELL from timing t2, and electrons stored in the floating gates will be released to the channels in the selected block, thereby resulting in that the entire memory cells become into data "1" state (erase state) with a low threshold voltage. In the unselected block, electron releasing will not occur because both of floating gates and word lines are boosted in potential due to capacitive coupling.

The above-described erase operation in this embodiment is the same as that in the conventional case. Note here that a practical data erase operation will be performed by repeat of erase voltage application and erase-verify in order to precisely control the threshold voltage distribution of the erase state.

Note in the erase operation that the sense amplifier circuit 3 is held inactive in the conventional case. That is, as shown in FIG. 7, the clamping transistor Q1 and precharging transistor Q2 are held off with Vss application to these gates BLCLAMP and BLPRE. The voltage application node VPRE of the precharging transistor Q2 is also held at Vss. On the other hand, a boosted voltage higher than the power supply voltage Vdd is applied to the node BLCRL, gates BLSe, BLSo of the bit line select transistors Q21 and Q22, and gates BIASe, BIASo of the bias transistors Q23 and Q24 at timing t1. With this voltage application, the node SABL and bit line BLe, BLo are charged up to Vdd−Vth2 (Vth2: threshold voltage of the transistors Q21-Q24) to be floating.

When the erase voltage Vera is applied at timing t2, the bit lines BLe, BLo are boosted in potential due to forward biasing via the p-type well. At this time in the conventional case, the node SABL will be boosted in potential due to capacitive coupling with the bit lines, and it may lead to destruction of the clamping transistor Q1.

In contrast to this, in this embodiment shown in FIG. 6, voltage Vsg (≧Vdd+Vth1; Vth1 is threshold voltage of transistors Q1 and Q2) is applied to the gate BLCLAMP of the clamping transistor Q1 and the gate BLPRE of the precharging transistor Q2 to turn on these transistors, and Vdd is to the voltage application node PRE in the data erase period. With these voltage applications, the connection node SABL is fixed at Vdd via the transistors Q2 and Q1. That is, the node SABL is held at Vdd and never boosted in spite of the bit line voltage boosting with the erase voltage Vera application. Therefore, the clamping transistor Q1 and precharging transistor Q2 will be prevented from being destroyed.

Note here that it is not always required to apply such a gate bias to the pracharge transistor Q2 and clamping transistor Q1 as to make them Vdd transferable. For example, apply Vdd to one on the gates BLPRE and BLCLAMP; and apply Vsg to the other, and the connection node SABL is fixed at Vdd−Vth1. Further, it will be allowed to apply Vss to the precharge voltage node PRE. In this case, the connection node SABL is set at Vss. In the above-described cases, the node SABL is not affected in potential due to the bit line voltage boosting, and it will prevent the clamping transistor Q1 and precharging transistor Q2 from being destroyed.

Figure 8:
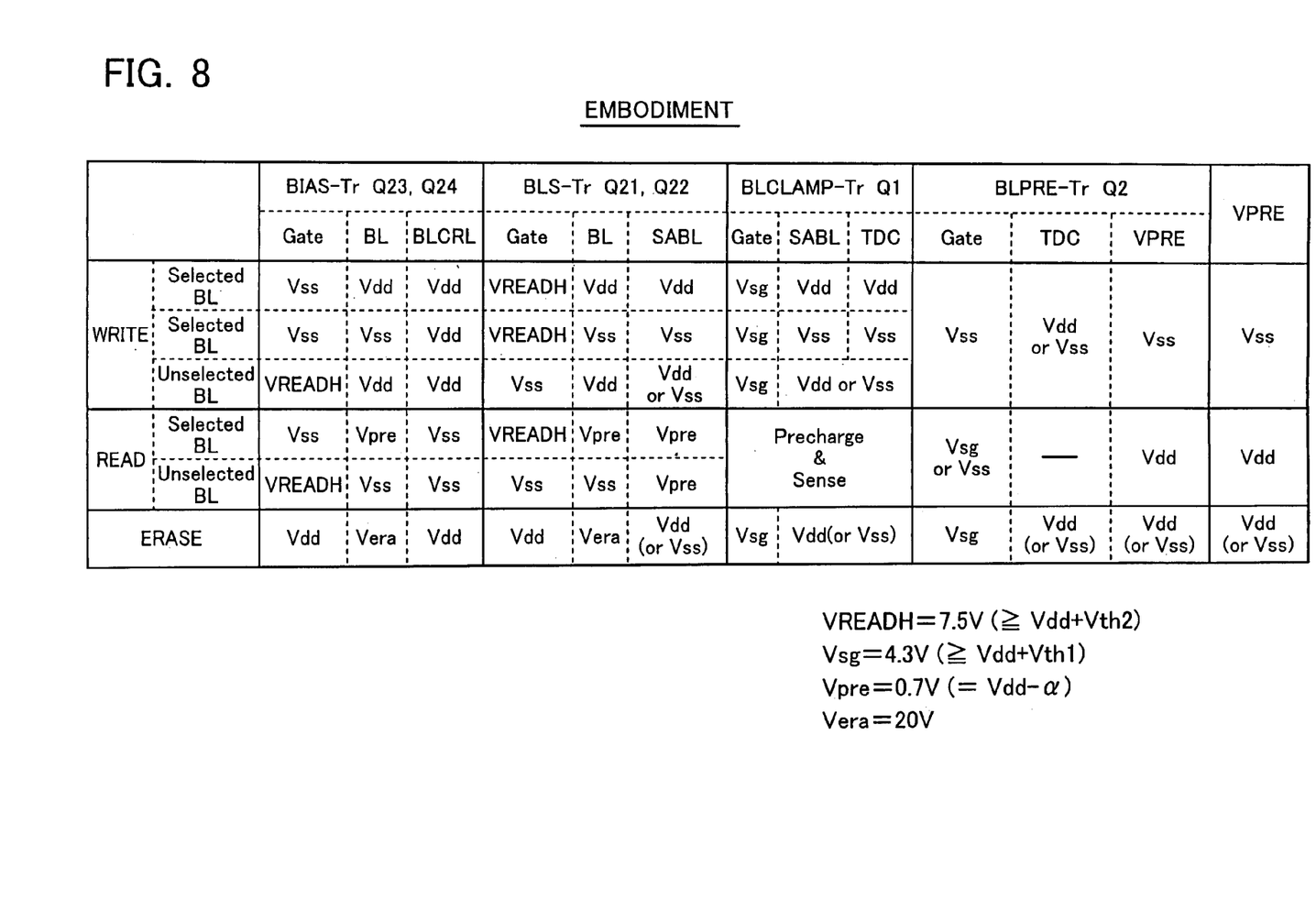
FIG. 8 shows voltage relationships of the sense amplifier transistors in the respective operation modes of the flash memory in accordance with the embodiment.

FIG. 8 shows transistor operation voltages of the sense amplifier circuit in a data erase mode (ERASE) together with in data write mode (WRITE) and read mode (READ) in this embodiment. As compared with this, FIG. 9 shows the similar transistor operation voltages in the conventional case.

Figure 9:
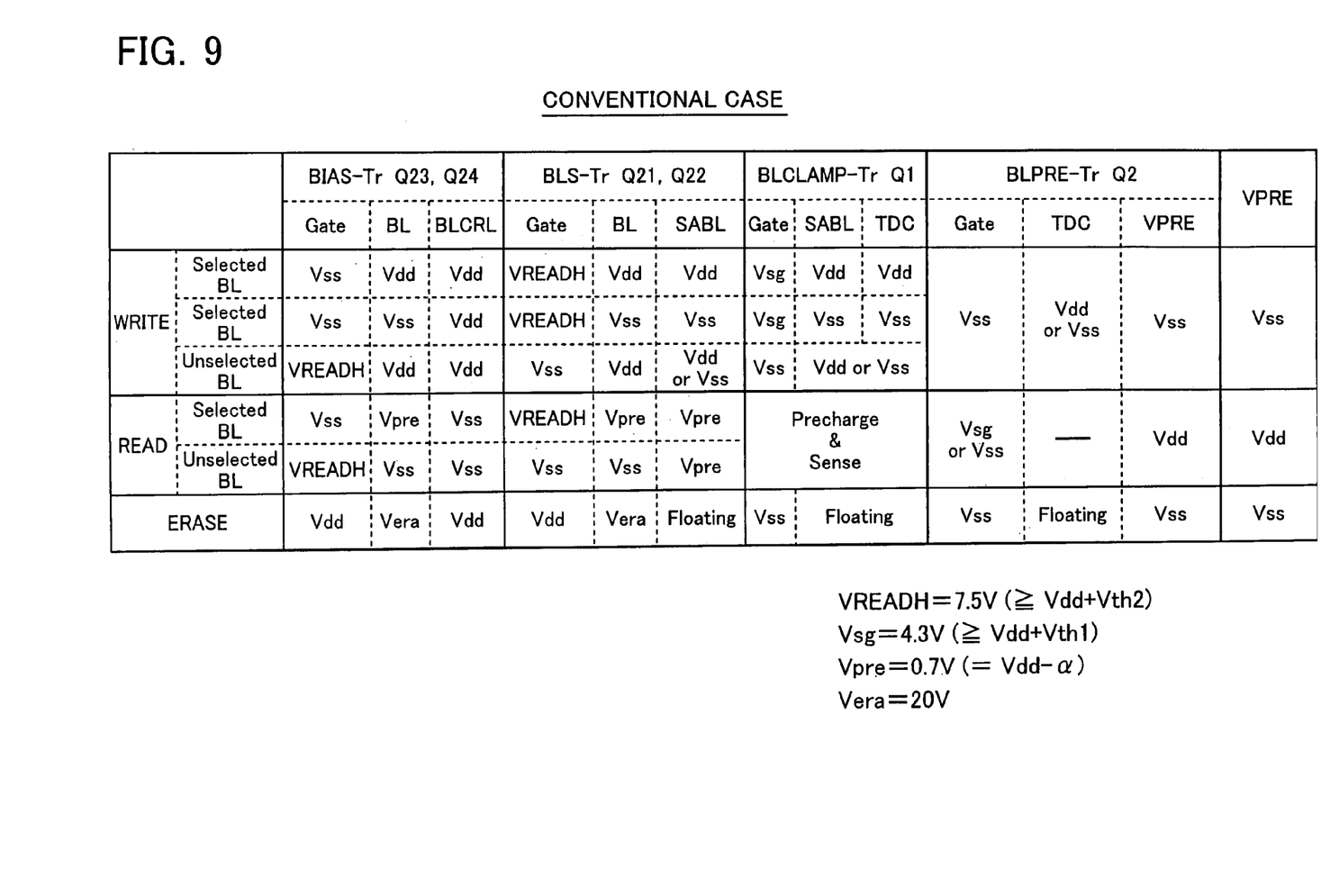
FIG. 9 shows voltage relationships of the sense amplifier transistors in the respective operation modes of the conventional flash memory.

The operation voltages at the data erase times in FIGS. 8 and 9 are different from each other as described above. There is no difference between the operation voltages in the data write and read modes in FIGS. 8 and 9. Data write and read operations will be explained in brief below.

In the data write mode, either of bit line select transistors Q21 and Q22 is turned on (with gate voltage VREADH), and a selected bit line is applied with Vss or Vdd in accordance with write data "0" or "1" via the clamping transistor Q1 (with gate voltage Vsg). Vdd is applied to an unselected bit line via either of the bias transistors Q23 and Q24. Then, the bit line voltages will be transferred to NAND cell channels. Apply a write voltage of about 20V to a selected word line, and electrons are injected into floating gates of "0" write cells, thereby shifting the threshold voltage thereof in the positive direction while electron injection will not occur in "1" write cells (write-inhibited cells).

In a practical data write sequence, to bring "0" write cells into a certain threshold voltage distribution range, write voltage application and write-verify read will be repeated.

Data read is performed with a bit line precharge operation for precharging selected bit lines to a certain voltage Vpre (=Vdd−α) and bit line voltage detecting operation for detecting whether the precharged bit lines are discharged via selected cells or not. The bit line precharge operation is performed with turning on the clamping transistor Q1 (with gate voltage Vpre+Vth1) and the precharge transistor Q2 (with gate voltage Vsg) simultaneously. At this time, one of the gates BLSe and BLSo of the bit line select transistors Q21 and Q22 is applied with VREADH (selected), and the other with Vss (unselected).

Data sense is performed as an operation for detecting the bit line discharge state after having discharged the bit line by selected cells for a certain period. This data sense operation will be performed as a charge-sharing operation between the sense node TDC and the bit line through the clamping transistor Q1, the gate BLCLAMP of which is applied with a sensing voltage Vsen+Vth1, in a state of the precharge transistor Q2 being off.

As another embodiment, an electric card using the non-volatile semiconductor memory devices according to the above-described embodiment of the present invention and an electric device using the card will be described bellow.

Figure 10:
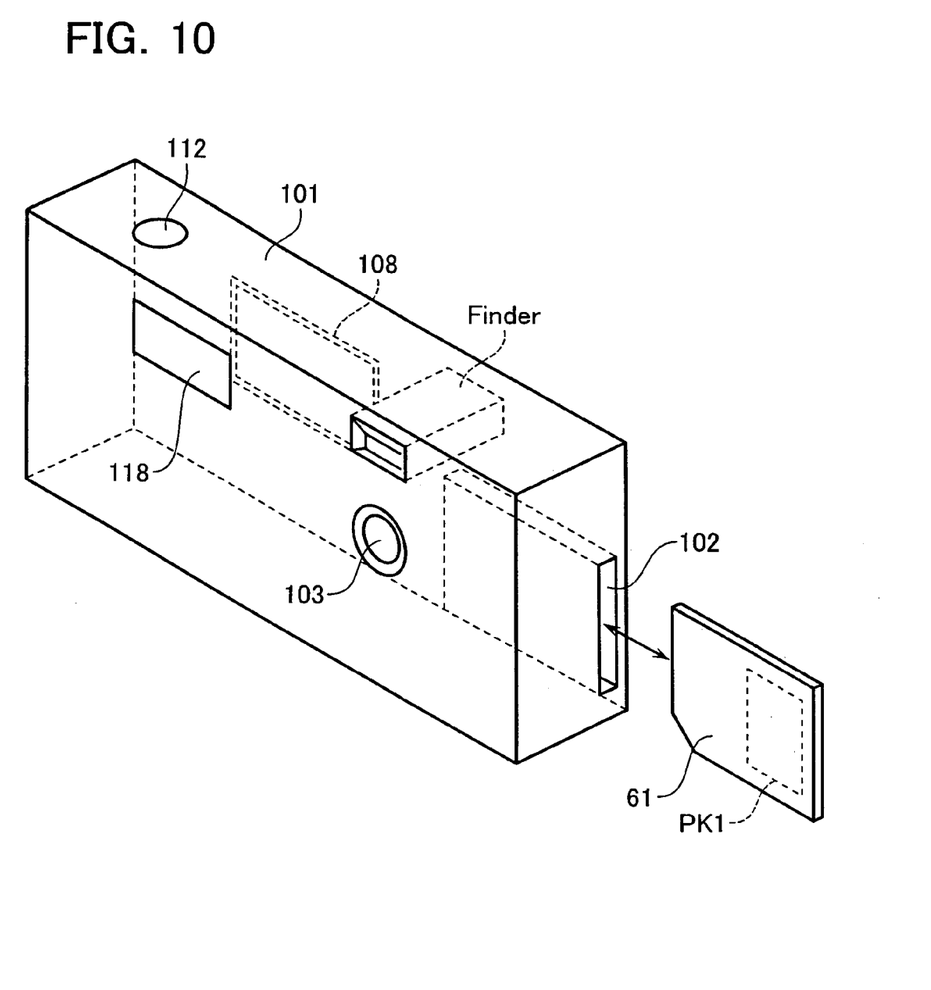
FIG. 10 shows another embodiment applied to a digital still camera.

FIG. 10 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiment is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 11:
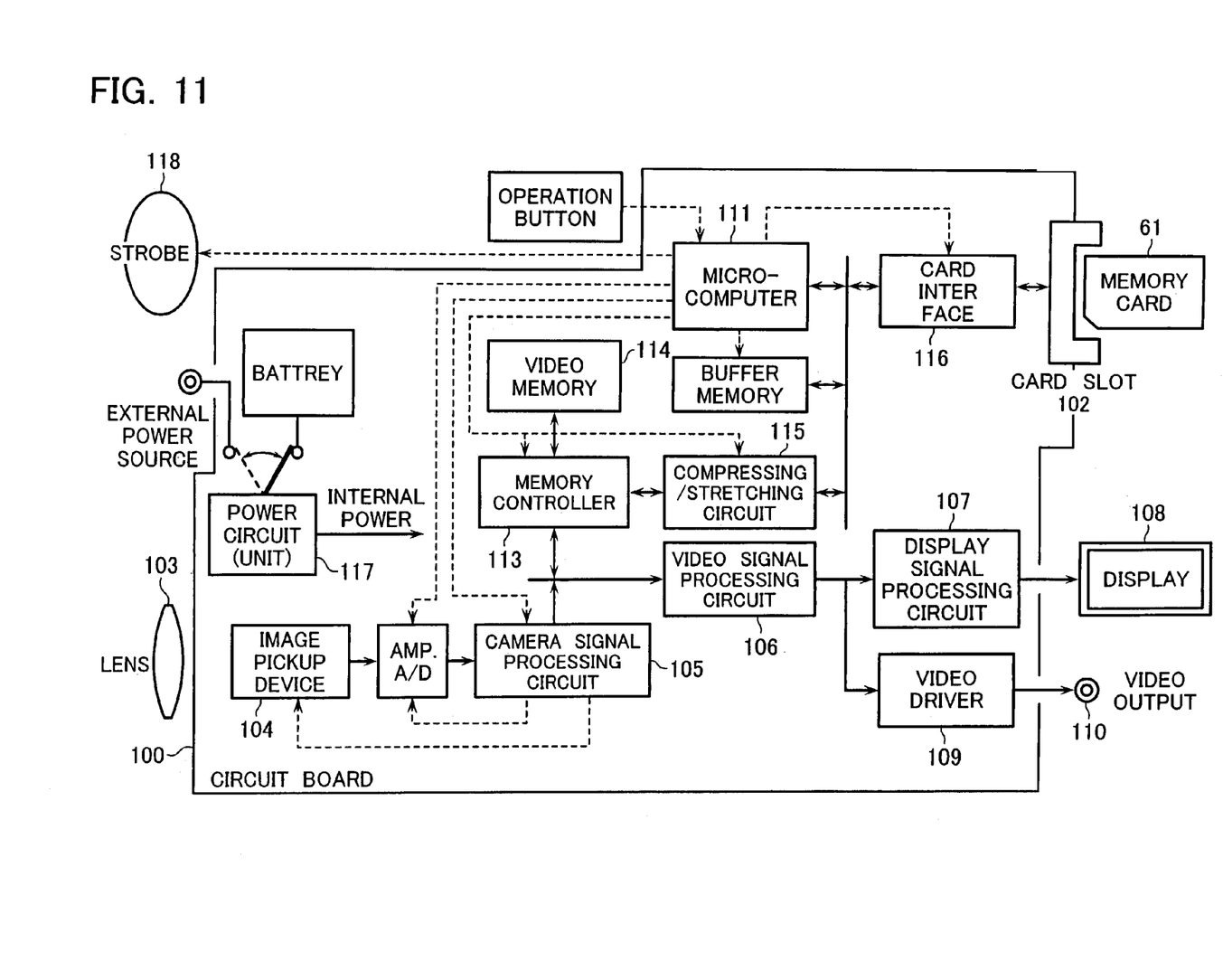
FIG. 11 shows the internal configuration of the digital still camera.
Figure 12A:
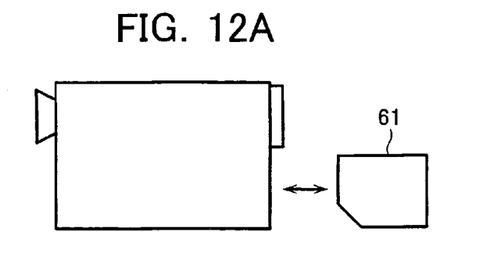
FIGS. 12A to 12J show other electric devices to which the embodiment is applied.
Figure 12B:
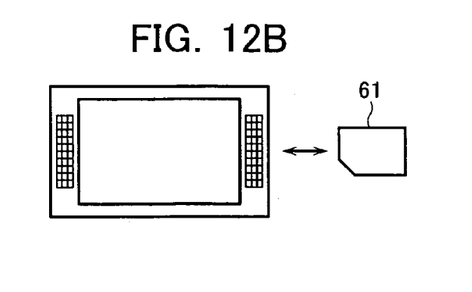
Figure 12C:
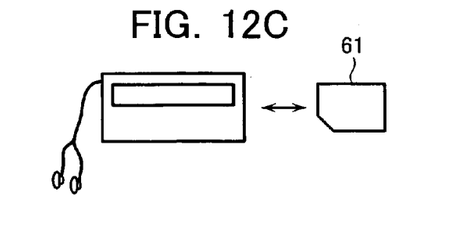
Figure 12D:
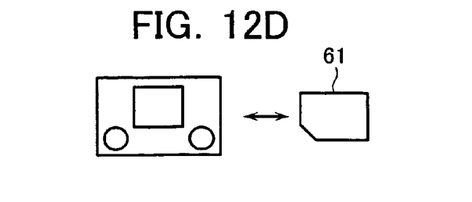
Figure 12E:
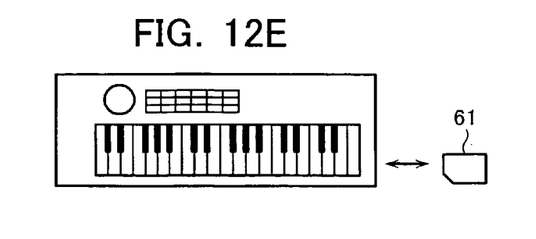
Figure 12F:
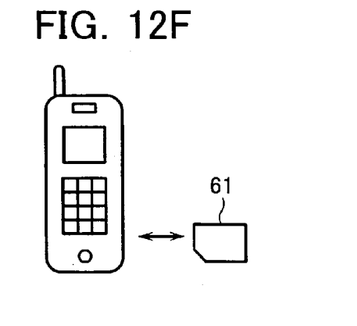
Figure 12G:
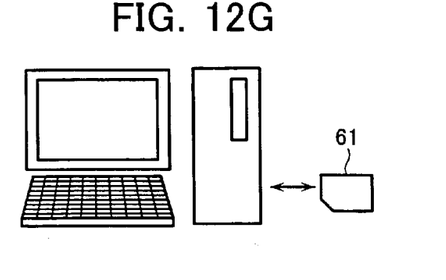
Figure 12H:
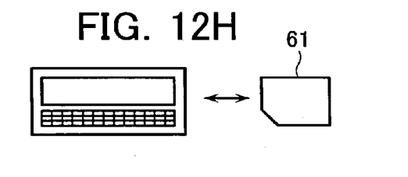
Figure 12I:
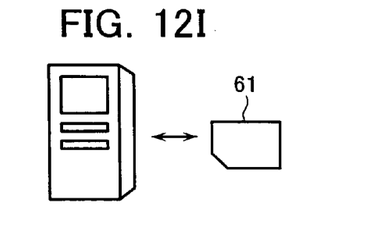
Figure 12J:
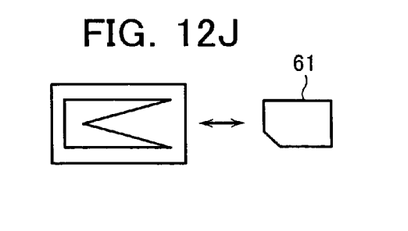

FIG. 11 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 12A to 12J, as well as in portable electric devices. That is, the electric card can also be used in a video camera shown in FIG. 12A, a television set shown in FIG. 12B, an audio apparatus shown in FIG. 12C, a game apparatus shown in FIG. 12D, an electric musical instrument shown in FIG. 12E, a cell phone shown in FIG. 12F, a personal computer shown in FIG. 12G, a personal digital assistant (PDA) shown in FIG. 12H, a voice recorder shown in FIG. 12I, and a PC card shown in FIG. 12J.

This invention is not limited to the above-described embodiment. It will be understood by those skilled in the art that various changes in form and detail may be made without departing from the spirit, scope, and teaching of the invention.

What is claimed is:

1. A semiconductor memory device comprising a memory cell array with electrically rewritable and non-volatile memory cells arranged therein, and a bit line control circuit connected to a bit line of said memory cell array to control and detect the bit line voltage in accordance with operation modes, wherein
   said bit line control circuit comprises a first transistor and a second transistor with a breakdown voltage higher than that of the first transistor, the second transistor being disposed between the first transistor and a bit line in said memory cell array to be serially connected to the first transistor, and wherein
   a connection node between the first and second transistors is fixed at power supply potential or ground potential at a time of data erase operation.

2. The semiconductor memory device according to claim 1, wherein
   said bit line control circuit comprises:
   a sense amplifier having the first transistor as a clamping transistor so disposed between a sense node and a bit line of said memory cell array as to serve for clamping and sensing the bit line voltage at a data read time; and
   a bit line select circuit having the second transistor as a bit line select transistor so disposed between the clamping transistor and a bit line as to select the bit line.

3. The semiconductor memory device according to claim 2, wherein
   said sense amplifier further comprises a precharging transistor, drain of which serves as a voltage supply node, and source of which is connected to the sense node, and wherein
   a certain voltage is applied to the voltage supply node while the clamping transistor and precharging transistor are driven to turn on simultaneously at the data erase time so that the connection node between the clamping transistor and bit line select transistor is substantially set at the certain voltage.

4. The semiconductor memory device according to claim 1, wherein
   said memory cell array comprises NAND cell units arranged therein, each NAND cell unit having a plurality of memory cells connected in series.

5. A semiconductor memory device comprising a memory cell array with electrically rewritable and non-volatile memory cells arranged therein, and a bit line control circuit connected to a bit line of said memory cell array to control and detect the bit line voltage in accordance with operation modes, wherein
   said bit line control circuit comprises:
   a sense amplifier having a clamping transistor so disposed between a sense node and a bit line of said memory cell array as to serve for clamping and sensing the bit line voltage at a data read time; and
   a bit line select circuit having a bit line select transistor so disposed between the clamping transistor and a bit line as to select the bit line, the breakdown voltage of the bit line select transistor being higher than that of the clamping transistor, and wherein
   a connection node between the clamping transistor and the bit line select transistor is fixed at power supply potential or ground potential at a time of data erase operation.

6. The semiconductor memory device according to claim 5, wherein
   said sense amplifier further comprises a precharging transistor, drain of which serves as a voltage supply node, and source of which is connected to the sense node, and wherein
   a certain voltage is applied to the voltage supply node while the clamping transistor and precharging transistor are driven to turn on simultaneously at the data erase time so that the connection node between the clamping transistor and bit line select transistor is substantially set at the certain voltage.

7. The semiconductor memory device according to claim 5, wherein
   said memory cell array comprises NAND cell units arranged therein, each NAND cell unit having a plurality of memory cells connected in series.

8. A semiconductor memory device comprising:
   a memory cell array with bit lines and electrically rewritable and non-volatile memory cells;
   a sense amplifier disposed for a pair of bit lines of said memory cell array with a first kind of transistors; and
   a bit line select circuit disposed between said sense amplifier and the pair of bit lines with a second kind of transistors, breakdown voltage of which is higher than that of the first kind of transistors, wherein
   a clamping transistor serving for clamping and sensing the bit line voltage in said sense amplifier and a bit line select transistor in said bit line select circuit are connected in series between a sense node and a bit line, and connection node thereof is fixed at power supply potential or ground potential at a time of data erase operation.

9. The semiconductor memory device according to claim 8, wherein
   the connection node is formed as a wiring, which is coupled to a diffusion layer of the bit line select transistor, at least a part of the wiring being disposed in parallel with and adjacent to the bit line.

10. The semiconductor memory device according to claim 8, wherein
    said sense amplifier further comprises a precharging transistor, drain of which serves as a voltage supply node, and source of which is connected to the sense node, and wherein
    a certain voltage is applied to the voltage supply node while the clamping transistor and precharging transistor are driven to turn on simultaneously at the data erase time so that the connection node between the clamping transistor and bit line select transistor is substantially set at the certain voltage.

11. The semiconductor memory device according to claim 8, wherein
    said memory cell array comprises NAND cell units arranged therein, each NAND cell unit having a plurality of memory cells connected in series.

12. A semiconductor memory device comprising:
    a memory cell array with a plurality of blocks, each block having electrically rewritable and non-volatile memory cells arranged therein;
    a sense amplifier configured to perform read data of said memory cell array, said sense amplifier having a first kind of transistors; and
    a bit line select circuit disposed between the bit lines of said memory cell array and said sense amplifier for selecting a bit line, said bit line select circuit having a second kind of transistors with a breakdown voltage higher than that of the first kind of transistors, wherein data erase is performed by a block of said memory cell array with applying an erase voltage to a well region, on which said memory cell array is formed, in such a state that the entire word lines in a selected block are applied with 0V; the entire bit lines are set in a floating state; and a connection node located between said sense amplifier and said bit line select circuit is fixed at power supply potential or ground potential at a time of data erase operation.

13. The semiconductor memory device according to claim 12, wherein said memory cell array comprises NAND cell units arranged therein, each NAND cell unit having a plurality of memory cells connected in series.

* * * * *